United States Patent
Lien et al.

(10) Patent No.: US 9,518,332 B2
(45) Date of Patent: Dec. 13, 2016

(54) ELECTROCHEMICAL PLATING

(75) Inventors: Chen-Kuang Lien, Kaohsiung (TW); Lun-Chieh Chiu, Tongxiao Township, Miaoli County (TW); Yu-Min Chang, Hsinchu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 1548 days.

(21) Appl. No.: 13/050,174

(22) Filed: Mar. 17, 2011

(65) Prior Publication Data

US 2012/0234683 A1 Sep. 20, 2012

(51) Int. Cl.
| | |
|---|---|
| *C25D 7/12* | (2006.01) |
| *C25D 21/12* | (2006.01) |
| *H01L 21/288* | (2006.01) |
| *H01L 21/768* | (2006.01) |

(52) U.S. Cl.
CPC .............. *C25D 7/123* (2013.01); *C25D 21/12* (2013.01); *H01L 21/2885* (2013.01); *H01L 21/76877* (2013.01); *H01L 21/76843* (2013.01); *H01L 21/76864* (2013.01)

(58) Field of Classification Search
CPC ................................. C25D 7/123; C25D 21/12
USPC ........................................................ 204/228.1
See application file for complete search history.

(56) References Cited

U.S. PATENT DOCUMENTS

| | | | |
|---|---|---|---|
| 6,428,673 B1* | 8/2002 | Ritzdorf et al. ................. | 205/84 |
| 6,440,291 B1* | 8/2002 | Henri et al. ..................... | 205/205 |
| 2006/0266653 A1* | 11/2006 | Birang et al. .................... | 205/83 |
| 2008/0128268 A1* | 6/2008 | Lopatin et al. ............ | 204/192.1 |
| 2010/0032310 A1* | 2/2010 | Reid et al. ..................... | 205/261 |

* cited by examiner

*Primary Examiner* — Bryan D. Ripa
(74) *Attorney, Agent, or Firm* — Haynes and Boone, LLP

(57) ABSTRACT

A method for electrochemical plating includes providing a wafer for an electrochemical plating (ECP) process, determining a wafer electrical property affecting the ECP process, adjusting a plating current or voltage applied in the ECP process based on the determined wafer electrical property, and electroplating the wafer with the adjusted plating current or voltage. A controller for controlling a power supply, and a system for electrochemical plating are also disclosed.

20 Claims, 8 Drawing Sheets

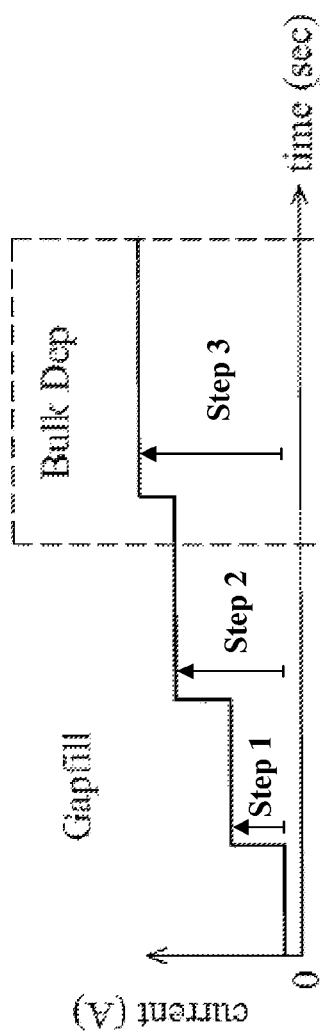
FIG. 3
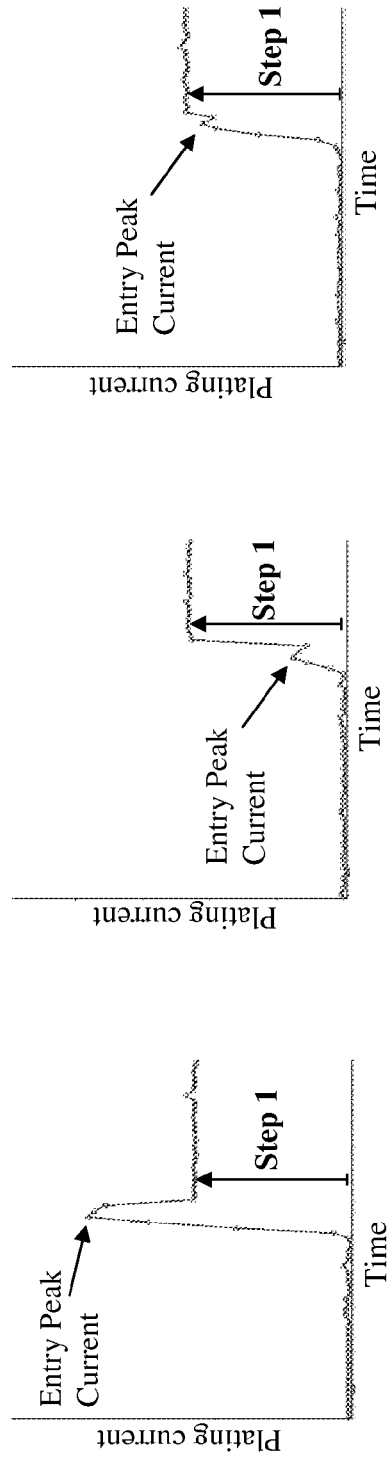
FIG. 4A
FIG. 4B
FIG. 4C

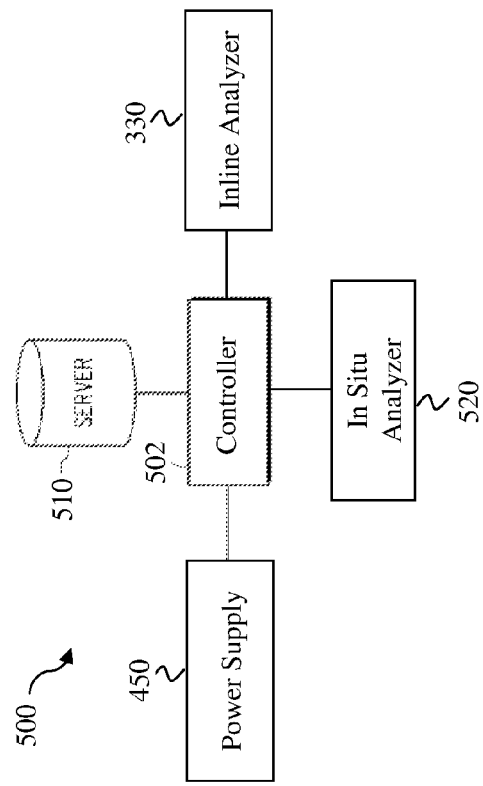
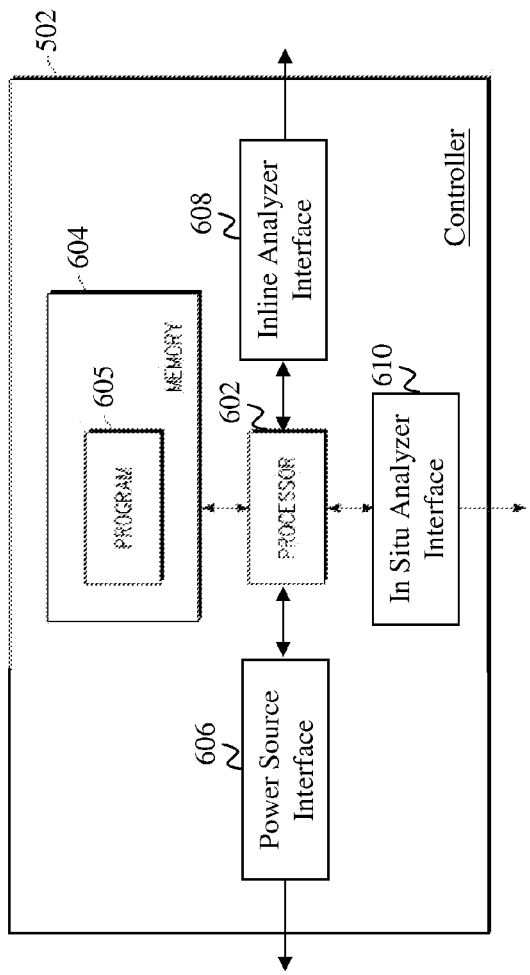

ELECTROCHEMICAL PLATING

TECHNICAL FIELD

The present disclosure relates generally to electrochemical plating (ECP), and more particularly, to a method, apparatus, and system for controlling a plating current or voltage in an ECP process.

BACKGROUND

Conductive interconnections on integrated circuits typically take the form of trenches and vias in the background art. In modern deep submicron integrated circuits, the trenches and vias are typically formed by a damascene or dual damascene process. Copper is currently used in ultra large scale integration (ULSI) metallization as a replacement for aluminum due to its lower resistivity and better electromigration resistance. Electrochemical copper deposition (ECD) has been adopted as the standard damascene or dual damascene process because of larger grain size (good electromigration) and higher deposition rates. More particularly, electrochemical plating (ECP) (electroplating) is well suited for the formation of small embedded damascene feature metallization due to its ability to readily control growth of the electroplated film for bottom-up filling, and the superior electrical conductivity characteristics of the electroplated film.

However, there are problems relating to the quality of the deposited metal film. One challenge facing damascene and dual damascene processing is the formation of defects, such as pits, voids and swirling defects. A number of obstacles impair defect-free electrochemical deposition of copper onto substrates having submicron, high aspect features. Thus, improved methods, systems, and apparatus for ECP processes is desirable.

SUMMARY

The present disclosure provides for various advantageous methods and apparatus of electrochemical plating. One of the broader forms of the present disclosure involves a method for electrochemical plating. The method includes providing a wafer for an electrochemical plating (ECP) process, determining a wafer electrical property affecting the ECP process, adjusting a plating current or voltage applied in the ECP process based on the determined wafer electrical property, and electroplating the wafer with the adjusted plating current or voltage.

Another of the broader forms of the present disclosure involves a controller for controlling a plating current or voltage in an electrochemical plating (ECP) process of a wafer. The controller includes a memory and a processor. The processor is configured to obtain a wafer electrical property affecting the ECP process, adjust the plating current or voltage applied in the ECP process based on the determined wafer electrical property, and apply the adjusted plating current or voltage to a wafer undergoing the ECP process.

Yet another of the broader forms of the present disclosure involves a system for electrochemical plating. The system includes a plating bath, a substrate mount for holding a wafer for an electrochemical plating (ECP) process within the plating bath, an anode, a power supply operably coupled to the anode and the substrate mount, and a controller as described above operably coupled to the power supply.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 3 is a graph illustrating a multiple step function model of plating current versus time at different stages of electroplating in accordance with various aspects of the present disclosure.

FIGS. 4A, 4B, and 4C illustrate an adjustment to plating current or voltage to substantially match an entry peak current of an ECP process to a first step function current level in accordance with various aspects of the present disclosure.

FIG. 7 is a block diagram of a system for obtaining wafer electrical properties in accordance with an embodiment of the present disclosure.

FIG. 8 is a block diagram of a controller of the system of FIG. 7 in accordance with an embodiment of the present disclosure.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
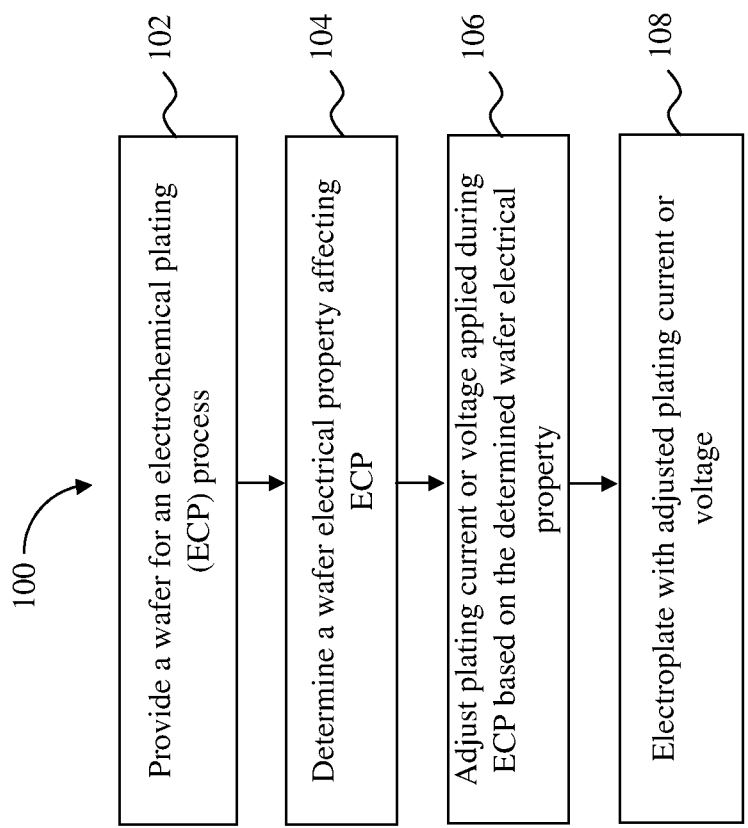
FIG. 1 is a flowchart illustrating a method of electrochemical plating in accordance with various aspects of the present disclosure.

FIG. 1 is a flowchart illustrating a method 100 of electrochemical plating (ECP) in accordance with various aspects of the present disclosure. Method 100 includes providing a wafer for an electrochemical plating (ECP) process at block 102, and then determining a wafer electrical property affecting the ECP process at block 104. The method further includes adjusting a plating current or voltage applied in the ECP process based on the determined wafer electrical property at block 106, and electroplating the wafer with the adjusted plating current or voltage at block 108.

In further embodiments, a method of ECP may include providing a first step function current level, adjusting the plating current or voltage to substantially match an entry peak current of the ECP process with the first step function current level, modifying an entry voltage to match the entry peak current to the first step current, and/or adjusting both entry voltage and first step current to match the entry peak current to the first step current, providing a plurality of wafers for the ECP process, and adjusting the plating current or voltage to maintain a substantially constant current density for each of the plurality of wafers during the ECP process. In yet further embodiments, a method of ECP may include determining the wafer electrical property by obtaining one of a wafer sheet resistance, a wafer surface current, or a wafer specification; determining the wafer electrical property offline from the ECP process, inline with the ECP process, or in situ with the ECP process; and determining the wafer electrical property in real time and adjusting the plating current or voltage in real time (e.g., during the electroplating process).

It is noted that similar features may be similarly numbered herein for the sake of simplicity and clarity. It is further noted that additional processes may be provided before, during, and after the method 100 of FIG. 1, and that some other processes may only be briefly described herein.

Figure 2:
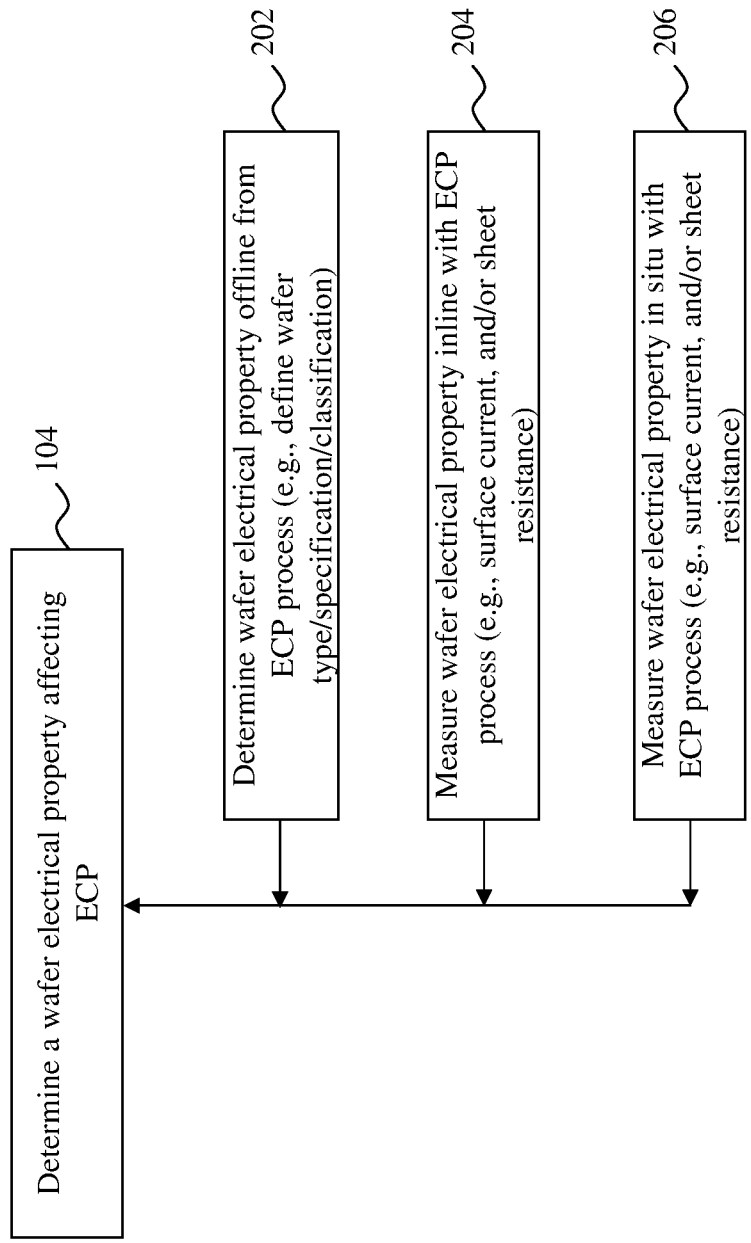
FIG. 2 is a flowchart illustrating a method of obtaining wafer electrical properties affecting ECP in accordance with various aspects of the present disclosure.

Referring now to FIG. 2, a flowchart illustrates a method 104 of determining or obtaining wafer electrical properties affecting ECP in accordance with various aspects of the present disclosure. At block 202, the wafer electrical property may be determined offline from the ECP process, for example by looking up a database or index. For example, the wafer electrical property may be provided via a wafer specification having electrical property data or may be inputted by a user that provides a wafer type and/or classification that corresponds to a certain wafer electrical property. Offline determination of the wafer electrical property may be provided from a database, a user interface, and the like.

At block 204, the wafer electrical property may be determined inline with the ECP process, for example by measuring a wafer physical property. For example, an inline analyzer (e.g., an inline analyzer 330 in FIG. 5) inline with an ECP process cell may be used to measure electrical properties of the wafer, such as a wafer surface current, and/or a wafer sheet resistance. In one example, the inline analyzer can be a tool outside the ECP tool, and may measure a wafer's resistance by a four-point probe detector after a barrier/seed process and before the ECP process. Such a detector may be installed in a barrier/seed tool, an ECP tool, or it may be a stand alone tool.

At block 206, the wafer electrical property may be determined in situ with the ECP process, for example by measuring a wafer physical property. For example, an in situ analyzer (e.g., an in situ analyzer 520 in FIG. 7) may be used to measure the wafer in situ with the ECP process to measure electrical properties of the wafer, such as a wafer surface current, and/or a wafer sheet resistance.

Thus, in accordance with various aspects of the present disclosure, the determined wafer electrical property may be used to adjust the plating current or voltage, to modify the entry voltage, and/or to adjust both the entry voltage and the first step current (e.g., by controlling the power supply) to substantially match an entry peak current of the ECP process with a first step function current level, and/or to maintain a substantially constant current density for each of a plurality of wafers processed by ECP. For example, if a wafer is determined to have a relatively higher or lower resistance, then a relatively higher or lower plating voltage/current, respectively, may be utilized.

It is noted that additional processes may be provided before, during, and after the method 104 of FIG. 2, and that some other processes may only be briefly described herein.

FIG. 3 is a graph illustrating a multiple step function model of plating current versus time at different stages of electroplating in accordance with various aspects of the present disclosure. In one example, when a conductive layer is deposited or electroplated on a semiconductor wafer with features thereon, the electric current of the multiple step function current is discretely increased at an initial gap-fill stage (e.g., step 1 current level or a first step function current level) and may be discretely increased to the bulk deposition stage (e.g., step 2 and 3 current levels or a second and third step function current levels).

FIGS. 4A, 4B, and 4C illustrate an adjustment to the plating current or voltage to substantially match an entry peak current of an ECP process to a first step function current level (e.g., step 1 current level) in accordance with various aspects of the present disclosure. FIG. 4A illustrates an example of an entry peak current level that is substantially above the first step function current level (e.g., based upon an applied potential of 0.8 V), and FIG. 4B illustrates an example of an entry peak current level that is substantially below the first step function current level (e.g., based upon an applied potential of 0.2 V). Disadvantageously, when the entry peak current level is substantially above or below the first step function current level, voids, pits, or other defects may be formed in the electroplated layer (e.g., in a trench or via). In accordance with an embodiment of the present disclosure, a wafer electrical property may be determined or obtained (e.g., a wafer surface current or sheet resistance) and used to adjust a plating current or voltage as necessary to substantially match an entry peak current to the first step function current level, as illustrated in FIG. 4C (e.g., based upon an applied potential of 0.5 V). Such entry peak current matching with the first step function current level advantageously allows for improved electroplating without the formation of voids or other defects in the fabricated metal layer.

Figure 5:
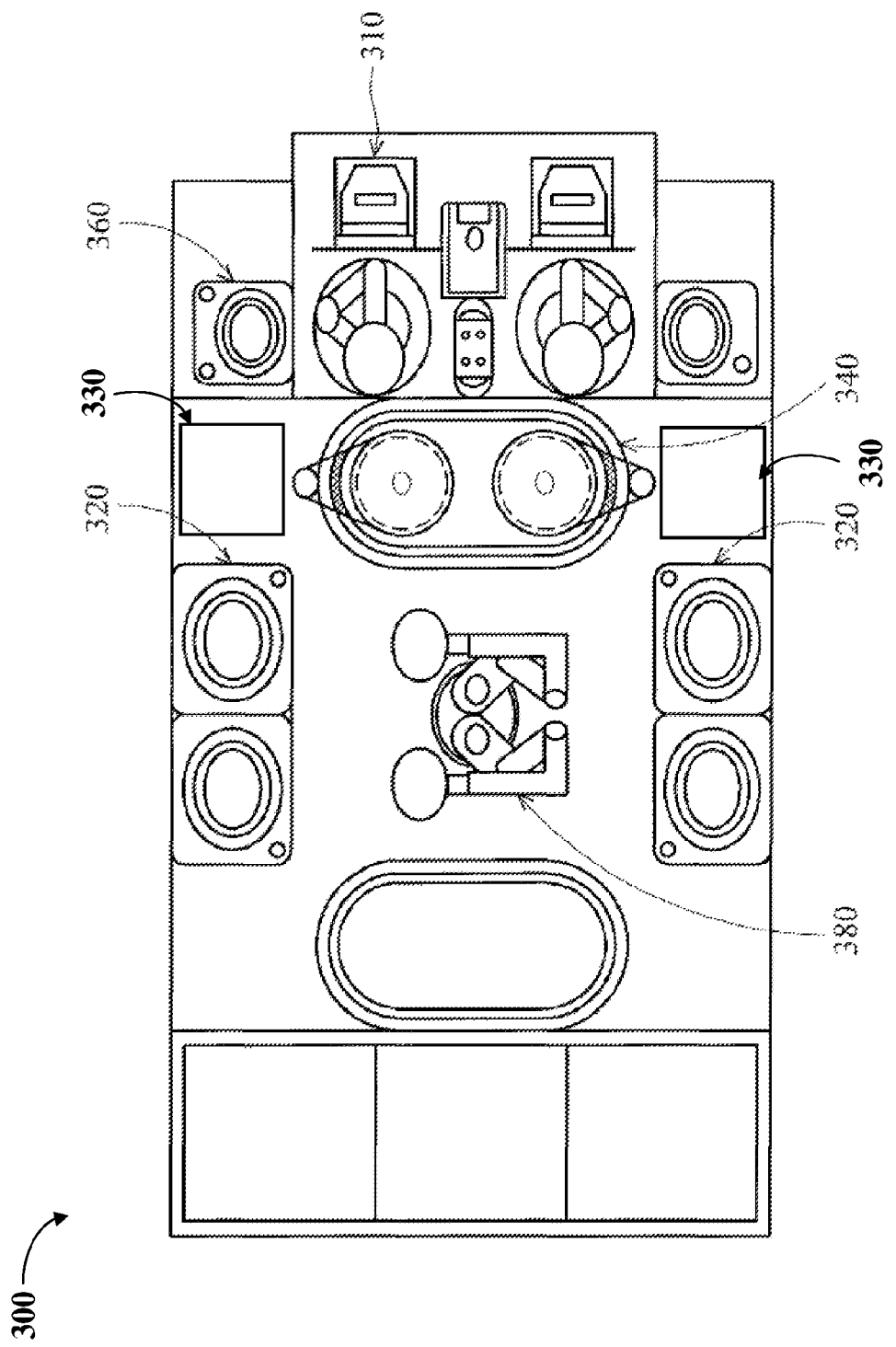
FIG. 5 illustrates a plan view of an embodiment of an ECP system in accordance with various aspects of the present disclosure.

FIG. 5 illustrates a plan view of an embodiment of an electrochemical plating (ECP) system 300 in accordance with various aspects of the present disclosure. Referring to FIG. 5, the ECP system 300 includes a loadlock station 310, a rapid thermal annealing (RTA) chamber 360, spin-rinse-dry (SRD) and edge bevel removal (EBR) chambers 340, a dual blade robot 380, and one or more electrochemical plating (ECP) process apparatus 320 and inline analyzers 330. ECP process apparatus 320 are further described below with respect to FIG. 6. In one example, inline analyzers 330 may include a four-point probe detector to measure sheet resistance, an ampere meter, a voltmeter, and/or an ohmmeter to analyze and/or measure wafer electrical properties. An electrolyte solution system (not shown) is positioned adjacent to the ECP system 300 and is individually connected to the ECP process cells 320 to circulate electrolyte solution for the electroplating process. The ECP system 300 also includes a controller having a programmable microprocessor (e.g., a controller 502 shown in FIG. 6). A substrate can be electroplated in the electrochemical plating process cells 320 and edge bevel removal (EBR) chambers 340.

Figure 6:
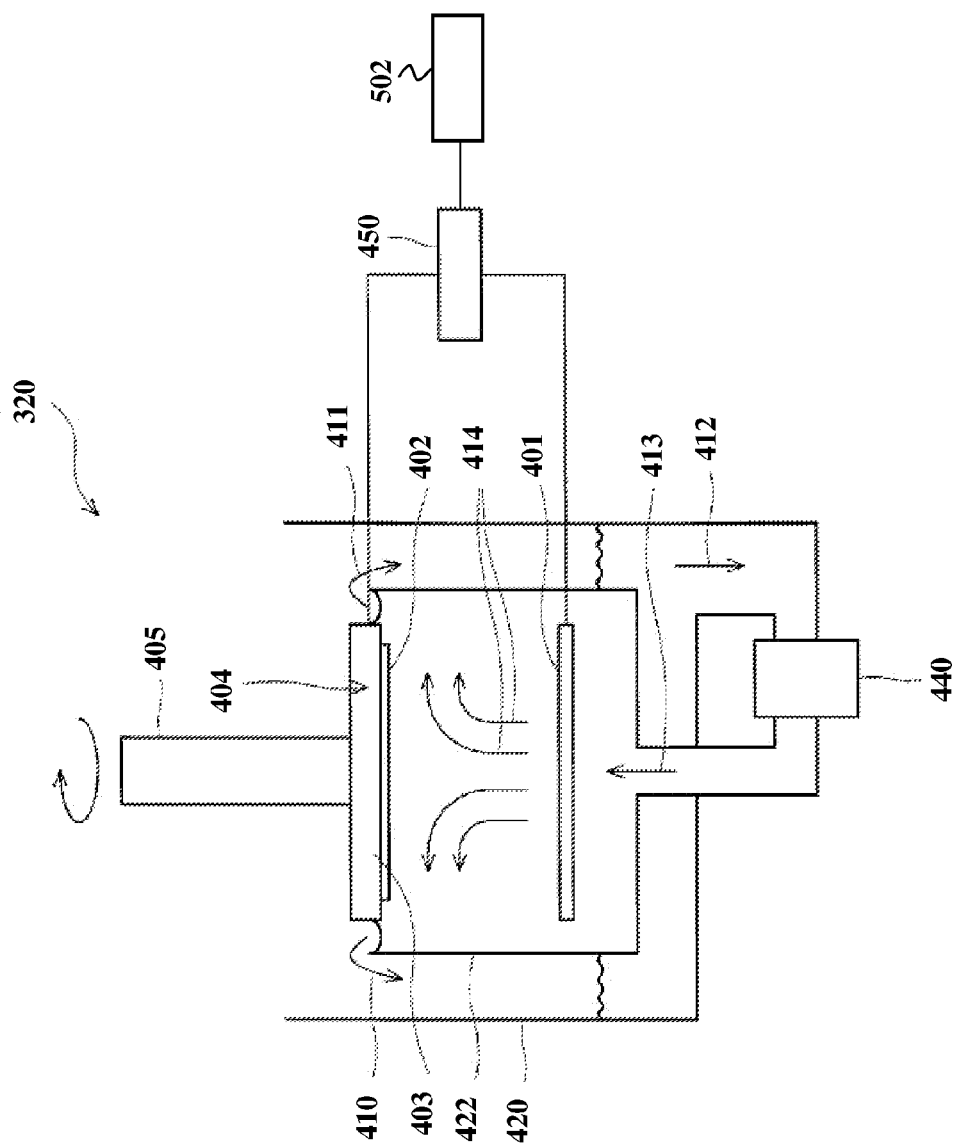
FIG. 6 illustrates an embodiment of an ECP apparatus in accordance with various aspects of the present disclosure.

FIG. 6 illustrates an embodiment of an ECP process cell 320 operably coupled to a controller 502 in accordance with various aspects of the present disclosure. Referring to FIG. 6, in one embodiment, ECP process cell 320 includes an anode 401, a substrate holder assembly 403 mounted on a rotatable spindle 405, a power supply 405 coupled to the anode 401 and the substrate holder assembly 403, and a plating bath 422. Controller 402 is operably coupled to power supply 405 in one embodiment. Although the present disclosure is described using a simplified electrochemical plating apparatus, those skilled in the art will appreciate that other electrochemical plating apparatuses are equally suitable to achieve the desired processing results.

During the electrochemical plating cycle, a wafer 402 is mounted in the substrate holder assembly 403, which is then placed in plating bath 422 containing a plating solution. As indicated by arrows 414, the plating solution is continually applied by a pump 440. Generally, the plating solution flows upwards to the center of wafer 402 and then radially outward and across wafer 402. The plating solution may then overflow from plating bath 422 to an overflow reservoir 420 as indicated by arrows 410 and 411. The plating solution may then be filtered (not shown) and returned to pump 440 as indicated by arrow 412, completing recirculation.

A power supply 450, such as a DC power supply, has a negative output lead electrically connected to wafer 402 through one or more slip rings, brushes, or contact pins. Thus, a negative output lead of power supply 450 may be electrically connected to wafer 402 via substrate holder assembly 403 or more directly connected. The positive output lead of power supply 450 is electrically connected to an anode 401 located in plating bath 422. In one example, power supply 450 may provide a multiple step function current as further described above with respect to FIG. 3. In other embodiments, auxiliary cathodes may be disposed outside the electrochemical cell 422 to provide an auxiliary electrical field such that a flux line density at the center region of the substrate holder assembly substantially equals that at the circumference of the substrate holder assembly. A second power supply may be configured between the anode 401 and the auxiliary cathodes.

During operation, power supply 450 biases wafer 402 to provide a negative potential relative to anode 401 generating electrical current from the anode 401 to wafer 402. Electrical current flows in the same direction as the net positive ion flux and opposite to the net electron flux. This causes an electrochemical reaction (e.g., $Cu^{2+}+2e^-=Cu$) on wafer 402 which results in deposition of the electrically conductive layer (e.g., copper) thereon. The ion concentration of the plating solution is replenished during the plating cycle, e.g., by dissolution of a metallic anode (e.g., $Cu=Cu^{2+}+2e^-$).

A typical electroplating solution includes electrolyte, such as $CuSO_4 Cu^{2+}$, $Cl^-$, $SO_4^{2-}$ and combinations thereof, and may further include suppressors and/or other additives. The suppressor is a long chain polymer comprising polyether polymers, polyethylene glycol (PEG), or polyoxyethylene-polyoxypropylene copolymer (EO-PO).

Referring now to FIG. 7, a block diagram illustrates a system 500 for determining or obtaining wafer electrical properties in accordance with an embodiment of the present disclosure. Controller 502 is operably coupled to power supply 450, an inline analyzer 330, a server 510, and/or an in situ analyzer 520. Probes in the analyzers 330, 520 may be used to obtain wafer electrical properties. In one example, analyzers 330, 520 and power supply 450 may be controlled by software running on controller 502. The software may be downloaded from storage media (e.g. hard drives) of a server 510 by controller 502 in one example. In other embodiments, the software may be located on a hard drive of a personal computer system or downloaded from a removable media (e.g. CD-Rom). The controller 502 executes the software to control the analyzers 330, 520 and/or power supply 450, thereby executing one or more of the methods described herein.

In one example, inline analyzer 330 may include a four-point probe detector to measure sheet resistance, an ampere meter, a voltmeter, and/or an ohmmeter to analyze and/or measure wafer electrical properties. In situ analyzer 520 may include a potentiostatic probe for contacting the wafer to measure potential or current of the wafer directly, a probe in the electrolyte to measure ionic flow to compute the plating condition, and/or an ampere meter or a voltmeter in the power loop to feedback the wafer's resistance. In another example, in situ analyzer 520 may be included within ECP process cell 320 (FIG. 6) to measure wafer electrical properties of wafer 402 in situ.

FIG. 8 is a block diagram of controller 502 of system 500 of FIG. 7 in accordance with an embodiment of the present disclosure. The controller 502 includes a processor 602, a memory 604, a power supply interface 606, an inline analyzer interface 608, and an in situ analyzer interface 610. In alternative embodiments, controller 502 may include only one analyzer interface or no analyzer interface. The memory 604 is accessible to the processor 602. In addition, the power supply interface 606, and analyzer interfaces 608, 610 are connected to the processor 602.

The processor 602 can be a microprocessor, controller, or other processor capable of executing a series of instructions. In various embodiments, processor 602 may comprise any type of a processor or a logic device (e.g., a programmable logic device (PLD) configured to perform processing functions). Processor 602 may be adapted to interface and communicate with power supply 450, inline analyzer 330, in situ analyzer 520, and/or server 510 (e.g., via power supply interface 606, inline analyzer interface 608, and/or in situ analyzer interface 610) to perform method and processing steps and/or operations, as described herein, such as to determine or obtain wafer electrical properties, control and/or adjust plating current or voltage, control biasing and other functions (e.g., values for elements such as variable resistors and current sources, switch settings for timing such as for switched capacitor filters, ramp voltage values, or other settings), along with conventional system processing functions as would be understood by one skilled in the art.

Memory 604 comprises, in one embodiment, one or more memory devices adapted to store data and information, including for example wafer electrical properties and information. Memory 604 may comprise one or more various types of memory devices including volatile and non-volatile memory devices, and/or a machine-readable medium capable of storing data in a machine-readable format. Processor 602 may be adapted to execute software stored in memory 604 so as to perform method and process steps and/or operations described herein.

In one example, the memory 604 is a computer readable medium such as random access memory (RAM), non-volatile memory such as flash memory or a hard drive, and the like. Memory 604 may further include a machine-readable medium capable of storing data in a machine-readable format. The memory 604 stores a program 605 including a set of instructions to manipulate the processor 602 to perform one or more of the methods disclosed herein. For example, the program 605 can manipulate the processor 602 to control the power supply interface 606 and analyzer interfaces 608, 610 and can be used to store data, including test results. Via the power supply interface 606 and analyzer interfaces 608, 610, the processor 602 controls the power supply 450, inline analyzer 330, and in situ analyzer 520, respectively, to determine wafer electrical properties and control plating current or voltage, as described herein. Controller 502 may further include a server interface to access server 510, which may provide wafer specifications to controller 502 or processor 602 for providing wafer electrical properties. In other embodiments, wafer specifications may be received in memory 604 or inputted into memory 604 by a user to provide wafer specifications to processor 602.

Accordingly, in various embodiments of the present disclosure, processor 605 is configured to adjust the plating current or voltage of power supply 450 to substantially match an entry peak current of the ECP process with a first step function current level; to adjust the plating current or voltage of power supply 450 to maintain a substantially constant current density for each of a plurality of wafers undergoing an ECP process; to obtain the wafer electrical property from one of a wafer sheet resistance, a wafer surface current, or a wafer specification; to obtain the wafer electrical property offline from the ECP process via a server (e.g., server 510) and/or a database, inline with the ECP process via an inline analyzer (e.g., inline analyzer 330), or in situ with the ECP process via an in situ analyzer (e.g., in situ analyzer 520); and/or to determine the wafer electrical property in real time (e.g., during the electroplating process) and to adjust the plating current or voltage of power supply 450 in real time (e.g., during the electroplating process).

Controller 502 may further include other components although not illustrated in the figures, such as a user interface in one example. The user interface may include a user input and/or interface device. For example, the user input and/or interface device may represent a rotatable knob (e.g., potentiometer), push buttons, slide bar, keyboard, or other device, that is adapted to generate a user input control signal. The processor may be adapted to sense control input signals from the user interface and respond to any sensed control input signals received therefrom. The processor may be adapted to interpret such a control input signal as a parameter value, as generally understood by one skilled in the art.

Controller 502 may perform the methods described above and below by a combination of hardware, firmware, and/or software utilizing memory 604, processor 602, and/or other components as necessary. It will be appreciated that other types of systems can be used in other embodiments to execute one or more of the methods described herein.

FIGS. 9A-9D are cross-sectional diagrams illustrating an electroplating method of fabricating a dual damascene interconnect structure in accordance with various aspects of the present disclosure. Generally, the method comprises physical vapor deposition of a barrier layer over the feature surfaces, and a conductive metal seed layer, preferably copper, over the barrier layer, followed by electroplating a conductive metal, preferably copper, over the seed layer to fill the interconnect structure/feature. Finally, the deposited layers and the dielectric layers may be planarized, e.g., by chemical mechanical polishing (CMP), to define a conductive interconnect feature.

Figure 9B:
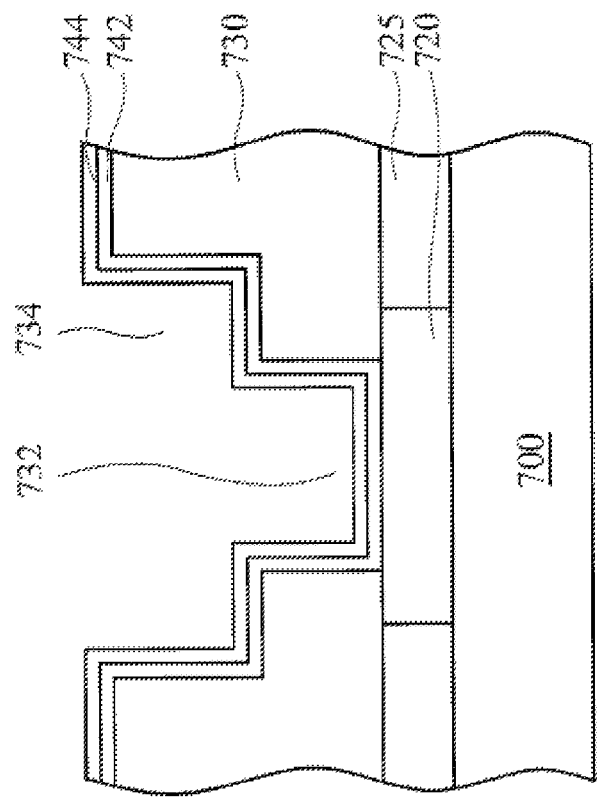
FIGS. 9A-9D are cross-sectional diagrams illustrating an electroplating method of a dual damascene interconnect structure in accordance with various aspects of the present disclosure.
Figure 9A:
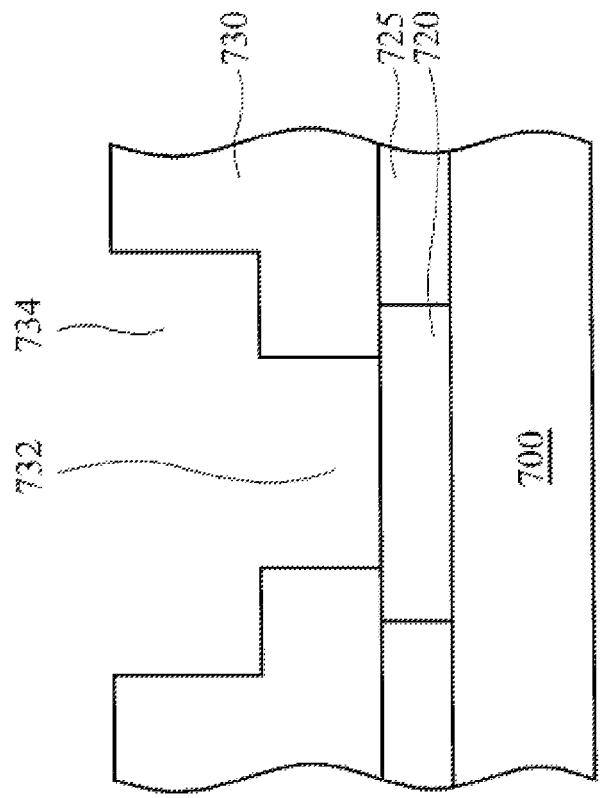

Referring to FIG. 9A, a substrate 700 is provided. A copper metal interconnect 720 is shown patterned within an insulating layer 725, such as silicon oxide. In addition, a dielectric layer 730 is deposited and patterned with a via portion 732 and a trench portion 734. The dual damascene structure is thus formed comprising a via portion 732 and a trench portion 734.

In one example, substrate 700 is a semiconductor substrate and may be comprised of silicon, or alternatively may include silicon germanium, gallium arsenic, or other suitable semiconductor materials. The substrate may further include doped active regions and other features such as a buried layer, and/or an epitaxy layer. Furthermore, the substrate may be a semiconductor on insulator such as silicon on insulator (SOI). In other embodiments, the semiconductor substrate may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET). The semiconductor substrate may include underlying layers, devices, junctions, and other features (not shown) formed during prior process steps or which may be formed during subsequent process steps.

Referring to FIG. 9B, a barrier layer 742, preferably comprising tantalum (Ta) or tantalum nitride (TaN), is deposited over the surface of the dielectric 730, including the surfaces of the via portion 732 and the trench portion 734. The barrier layer 742 is typically deposited using physical vapor deposition (PVD) by sputtering or reactive PVD. The barrier layer 742 limits the diffusion of copper into the semiconductor substrate and the dielectric layer, thereby dramatically increasing reliability. For a high conductance barrier layer comprising tantalum, the barrier layer is preferably deposited by low temperature (<350 degrees Celsius) PVD and then annealed at between about 350 degrees Celsius and about 600 degrees Celsius, or deposited by PVD at between about 350 degrees Celsius and about 600 degrees Celsius. Preferably, a barrier layer has a film thickness between about 250 angstroms and about 500 angstroms for an interconnect structure/feature having sub-micron opening width. In one example, the barrier layer has a thickness between about 500 angstroms and about 3000 angstroms. A copper seed layer 744 is deposited over the barrier layer 34 using PVD. The copper seed layer 744 provides good adhesion for subsequently electroplated copper. In one example the seed layer has a thickness between about 500 angstroms and about 3000 angstroms.

Figure 9D:
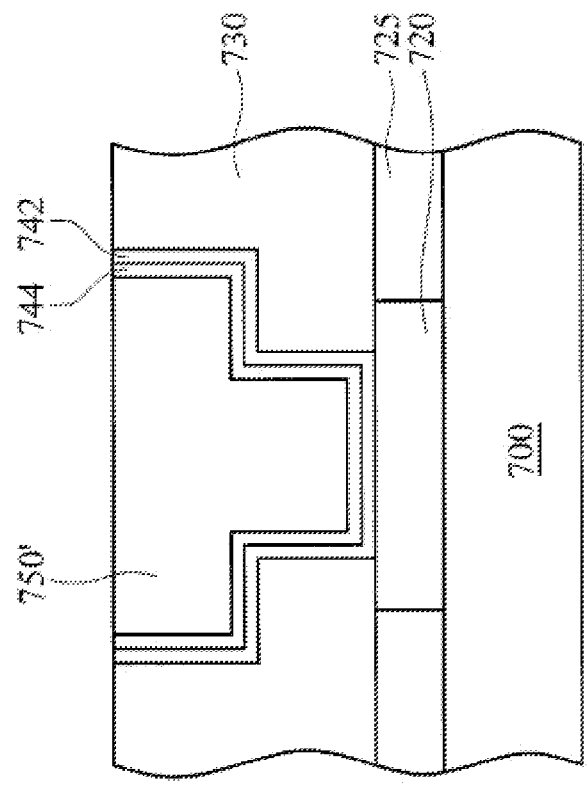
Figure 9C:
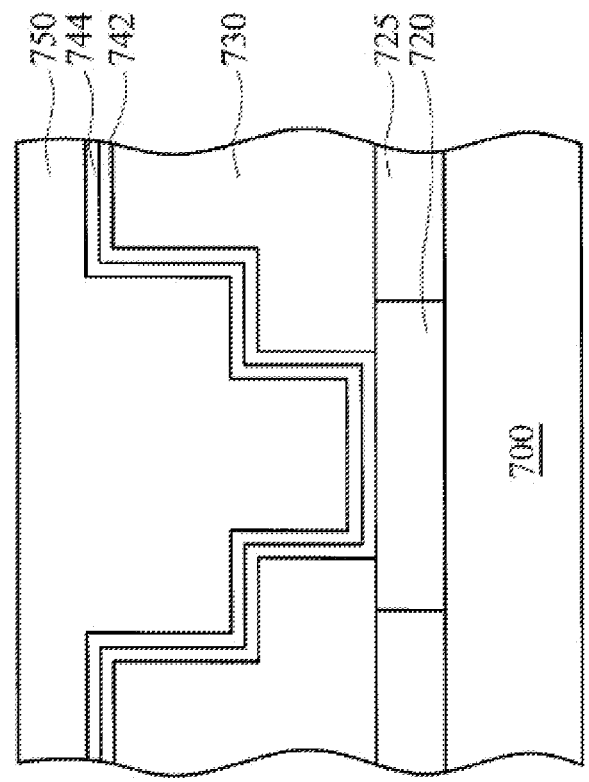

Referring to FIG. 9C, a conductive layer such as a copper layer 750 is electroplated over the copper seed layer 744 to metalize the dual damascene structure. The conductive layer electrochemically deposited by the ECP apparatus 320 with controlled plating current or voltage in accordance with various aspects of the present disclosure. In one example, the ECP process is performed by a deposition current in a range between about 0.1 and 100 mA/cm$^2$, and at a deposition temperature in a range between about 0 and about 50 degrees Celsius. In one example, the thickness of the conductive layer may exceed 50 angstroms. In one embodiment, prior to electroplating, a wafer electrical property affecting ECP is determined or obtained, and then the plating current or voltage applied during electroplating is adjusted based on the determined or obtained wafer electrical property. In alternative embodiments, a wafer electrical property may be determined or obtained in real time while electroplating, and the plating current or voltage may be adjusted in real time based on the determined or obtained wafer electrical property. Advantageously, the present disclosure provides for fabrication of the conductive layer substantially without voids, pits, or other defects.

Referring to FIG. 9D, the top portion of the processed substrate, i.e., the exposed electroplated copper layer 750 (shown in FIG. 9C), may then be planarized, for example by chemical mechanical polishing (CMP). During planarization, portions of the copper layer 950, copper seed layer 944, barrier layer 942, and a top surface of the dielectric layer 930 are removed from the top surface of the substrate, leaving a fully planar surface with conductive interconnect features, such as a dual damascene structure.

The present disclosure provides for various advantageous methods and apparatus of electrochemical plating. One of the broader forms of the present disclosure involves a method for electrochemical plating. The method includes providing a wafer for an electrochemical plating (ECP) process, determining a wafer electrical property affecting the ECP process, adjusting a plating current or voltage applied in the ECP process based on the determined wafer electrical property, and electroplating the wafer with the adjusted plating current or voltage.

Another of the broader forms of the present disclosure involves a controller for controlling a plating current or voltage in an electrochemical plating (ECP) process of a wafer. The controller includes a memory and a processor. The processor is configured to obtain a wafer electrical property affecting the ECP process, adjust the plating current or voltage applied in the ECP process based on the determined wafer electrical property, and apply the adjusted plating current or voltage to a wafer undergoing the ECP process.

Yet another of the broader forms of the present disclosure involves a system for electrochemical plating. The system includes a plating bath, a substrate mount for holding a wafer for an electrochemical plating (ECP) process within the plating bath, an anode, a power supply operably coupled to the anode and the substrate mount, and a controller as described above operably coupled to the power supply.

Advantageously, the present disclosure does not utilize a fixed electroplating recipe but utilizes wafer electrical properties to provide an advantageous plating current or voltage to avoid defect formation in the deposited metal layer, to improve yield, and to improve circuit reliability. In one example, the plating current or voltage may be adjusted in real time and/or dynamically depending on a particular wafer, wafer section, or special condition, to avoid defect formation. In other words, according to various aspects of the present disclosure, an electroplating current or voltage may be automatically tuned to a particular wafer or wafer condition.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A controller for controlling an electrochemical plating (ECP) process, the controller comprising:
a memory; and
a processor configured to:
receive a process parameter specifying at least one of a current or a voltage to be applied to a wafer;
obtain a wafer electrical property affecting the ECP process including at least one of a surface current of the wafer or a sheet resistance of the wafer;
adjust the process parameter to be applied in the ECP process based on the obtained wafer electrical property,
wherein the process parameter includes an entry voltage, and
wherein the adjusting of the process parameter includes adjusting the entry voltage such that a peak entry current of the ECP process substantially matches a plating current of the ECP process induced following the peak entry current; and
apply the adjusted process parameter to the wafer undergoing the ECP process.

2. The controller of claim 1, wherein the processor is configured to further adjust the process parameter to maintain a substantially constant current density for each of a plurality of wafers undergoing the ECP process.

3. The controller of claim 1, wherein the processor is configured to obtain the wafer electrical property offline from the ECP process, inline with the ECP process, or in situ with the ECP process.

4. The controller of claim 1, wherein the processor is configured to determine the wafer electrical property in real time and to adjust the process parameter in real time.

5. The controller of claim 1, further comprising one of a power supply interface, an inline analyzer interface, or an in situ analyzer interface.

6. The controller of claim 1, wherein the adjusted process parameter includes a plurality of independent values corresponding to the at least one of the current or the voltage to be applied at specified times during the ECP process.

7. The controller of claim 6, wherein a first value of the plurality of independent values corresponds to a gapfill process and wherein a second value of the plurality of independent values corresponds to a bulk deposition process.

8. The controller of claim 1, wherein the plating current is associated with a plating step of the ECP process, and wherein the adjusting such that the peak entry current substantially matches the plating current further includes adjusting the at least one of the current or the voltage to be applied to the wafer during the plating step of the ECP process.

9. The controller of claim 8, wherein the plating step corresponds to a gapfill process and wherein the plating current corresponds to a gapfill current.

10. A system for electrochemical plating, comprising:
a plating bath;
a substrate mount for holding a wafer for an electrochemical plating (ECP) process within the plating bath;
an anode;
a power supply operably coupled to the anode and the substrate mount; and
a controller operably coupled to the power supply, the controller including:
a memory; and
a processor configured to:
obtain a wafer electrical property that includes at least one of a surface current of the wafer or a sheet resistance of the wafer; and
control the power supply to adjust an amount of energy thereby applied to the wafer based on the at least one of the surface current of the wafer or the sheet resistance of the wafer such that a peak current associated with entry of the wafer into the plating bath substantially matches a current associated with a gapfill process; and apply the adjusted amount of energy to the wafer undergoing the ECP process.

11. The system of claim 10, wherein the processor is configured to further adjust the amount of energy to maintain a substantially constant current density for each of a plurality of wafers undergoing the ECP process.

12. The system of claim 10, wherein the processor is configured to obtain the wafer electrical property offline from the ECP process, inline with the ECP process, or in situ with the ECP process using one of a database, an inline analyzer, or an in situ analyzer, respectively.

13. The system of claim 10, wherein the processor is configured to obtain the wafer electrical property in real time and to adjust the amount of energy in real time.

14. A fabrication system comprising:
a substrate holding assembly configured to receive a semiconductor substrate and to introduce the semiconductor substrate into a plating solution;
a power supply configured to provide an electrical current to the plating solution to thereby deposit a conductive material on the semiconductor substrate; and
a controller configured to:
receive a property of the semiconductor substrate including at least one of a sheet resistance of the semiconductor substrate or a surface current measurement of the semiconductor substrate;
determine at least one of a current function or a voltage function for electroplating of the semiconductor substrate based on the received property such that a peak entry current applied to the substrate substantially matches a plating current applied to the substrate following the peak entry current; and
control the power supply to provide the electrical current to the plating solution according to the at least one of the current function or the voltage function.

15. The fabrication system of claim 14 further comprising a probe configured to measure the property of the semiconductor substrate and to provide the property to the controller.

16. The fabrication system of claim 14, wherein the at least one of the current function or the voltage function includes a plurality of independent step values over time.

17. The fabrication system of claim 16, wherein a first value of the plurality of independent step values corresponds to a gapfill electroplating process and wherein a second value of the plurality of independent step values corresponds to a bulk deposition electroplating process.

18. The fabrication system of claim 17, wherein the second value is ordered subsequent to the first value in time.

19. The fabrication system of claim 14, wherein the controller is further configured to determine the at least one of the current function or the voltage function during electroplating of the semiconductor substrate.

20. The fabrication system of claim 14, wherein the determined at least one of the current function or the voltage function includes a plurality of independent values each associated with a timeframe of a plating process.

* * * * *